(12) United States Patent
Yoshitome et al.

(10) Patent No.: US 6,689,488 B2
(45) Date of Patent: Feb. 10, 2004

(54) LEAD-FREE SOLDER AND SOLDER JOINT

(75) Inventors: Daisuke Yoshitome, Aichi (JP); Yasuhisa Tanaka, Aichi (JP)

(73) Assignee: Taiho Kogyo Co., Ltd., Toyota (JP)

( * ) Notice: Subject to any disclaimer, the term of this patent is extended or adjusted under 35 U.S.C. 154(b) by 58 days.

(21) Appl. No.: 10/067,338

(22) Filed: Feb. 7, 2002

(65) Prior Publication Data

US 2002/0150787 A1 Oct. 17, 2002

(30) Foreign Application Priority Data

Feb. 9, 2001 (JP) ........................................ 2001-033206

(51) Int. Cl.7 ........................... B32B 15/01; C22C 13/00
(52) U.S. Cl. ...................... 428/647; 420/557; 420/558; 420/560; 428/648
(58) Field of Search ................................ 428/647, 648; 420/557, 558, 560

(56) References Cited

U.S. PATENT DOCUMENTS 5,520,752 A    5/1996   Lucey, Jr. et al. .......... 420/560

FOREIGN PATENT DOCUMENTS

| EP | 0 847 829 A1 | 6/1998 | |
| EP | 0 858 859 A1 | 8/1998 | |
| JP | 09-155586 | 6/1997 | |
| JP | 09-155586 A * | 6/1997 | ........... C22C/13/00 |
| WO | WO 97/09455 | 3/1997 | |
| WO | WO-97/09455 A1 * | 3/1997 | ........... C22C/13/00 |

* cited by examiner

*Primary Examiner*—Robert R. Koehler
(74) *Attorney, Agent, or Firm*—Armstrong, Kratz, Quintos, Hanson & Brooks, LLP

(57) ABSTRACT

A lead-free solder, which contains from 1.0 to 3.5% of Ag, from 0.1 to 0.7% of Cu, and from 0.1 to 2.0% of In, the balance consisting of unavoidable impurities and Sn, is appropriate for ball-grid array (BGA). The solute Cu suppresses growth of intermetallic compound formed at the interface between the bulk of solder and a Ni or Cu conductor.

13 Claims, No Drawings

US 6,689,488 B2

LEAD-FREE SOLDER AND SOLDER JOINT

BACKGROUND OF INVENTION

1. Field of Invention

The present invention relates to lead-free solder, more particularly to lead-free solder suited for a ball-grid array and the like. In addition, the present invention relates to a solder joint having improved thermal fatigue property.

2. Description of Related Art

The binary Sn—Ag alloy used as the lead-free solder has a eutectic point of Ag=3.5 mass % at temperature of 221° C. The binary Sn—Ag alloy having the eutectic composition has such a structure that the Sn—$Ag_3$Sn eutectic disperses in the grain boundaries of Sn primary crystals.

The known Sn—Ag based alloy includes Sn-3.5% Ag-0.7% Cu, that is, 0.7% of Cu is added to the eutectic Sn-3.5% Ag. Allegedly, the melting point of the Sn-3.5% Ag-0.7% Cu is 217–219° C. and is hence lower than that of the binary Sn—Ag alloy.

It is described in U.S. Pat. No. 5,527,628 that the Sn-4.7% Ag-1.7% Cu corresponds to the eutectic composition at approximately 217° C. In this patent, it is proposed that the Sn, Ag and Cu contents are shifted from the eutectic composition in such a range that the melting point does not become higher than the eutectic point by 15° C. or more. It is described that at least two inter metallic compounds, for example, Cu-rich $Cu_6Sn_5$ and Ag-rich $Ag_3$Sn, are finely dispersed in the β Sn phase, and increase the strength and fatigue strength of the alloy.

The present assignee and Toyota Central Research Co., Ltd. have developed a highly reliable Sn-2.5Ag-3.0Bi-1.0In-0.2Cu (5$^{th}$ Symposium on "Microjoining and Assembly Technology in Electronics" Feb. 4–5, 1999, pages 403–408). This alloy has melting point of from 202 to 216° C. and improved resistance against thermal fatigue.

Since Bi has an outstanding effect to lower the melting point of Sn—Ag based alloy and to strengthen the alloy, Bi is frequently added into the Pb-free Sn—Ag based solder alloy (for example, Japanese Patent No. 2805595, Japanese Unexamined Patent Publications (kokai) Nos. 8-132277, 8-187590, 8-206874 and 10-34376) When the solder joint undergoes thermal fatigue, the stress is repeatedly imparted to the joint portions due to the difference in the coefficients of thermal expansion of the constructional parts of the solder joint. "Materia" Vol. 38, No. 12 (1999) pages 942–946 reports research on evaluation of the thermal fatigue property by a tensile test method under varying stress speeds. According to this report, a composition similar to the Sn-2.5Ag-3.0Bi-1.0In-0.2Cu alloy mentioned above is tested, and improved resistance of this alloy against thermal fatigue is confirmed.

Japanese Domestic Publication (tokuhyo) 2001-504760 of PCT/US98/02022 (International publication WO98/34755 dated Aug. 13, 1998) describes that, since the ternary eutectic Sn-4.7% Ag-1.7% Cu incurs disadvantageous growth of the intermetallic compound layer, Ni, Co, Fe and the like are added to this alloy. When a Cu conductor is soldered with the Sn-based solder, an intermetallic compound layer, such as a $Cu_6Sn_5$ layer, is thin at the interface. According to the theory proposed in this domestic publication, the solidified intermetallic compound layer is thin due to the addition of Ni and the like. Ni and the like modify the shape of the intermetallic compound layer in such a manner as to suppress its growth.

Minute balls of 0.1 to 1.2 mm in size, referred to as the BGA balls, are used in electric bonding of electronic parts. Since the BGA balls are appropriate for the multi-pin bonding method, they are being used more and more in recent years. The Sn—Ag based solder free of lead is used for the BGA ball solder as well. In this bonding method using the BGA balls, the difference in the coefficient of thermal expansion of the constructional parts induces stress in the bonding portions of the solder balls and the Ni or Cu land.

The thermal fatigue fracture of solder occurs both in the bulk of the solder and the bonding interface. "Materia" Vol.38, No.12(1999) pages 942–946 elucidates the former thermal fatigue fracture. Meanwhile, there is a published investigation that, since Sn-3.5Ag-5Bi is strengthened by means of Bi addition, the fatigue fracture is attributable to the intermetallic compounds in the bonding interface (Surface Mounting Pocket Handbook, Lead-Free Solder Technique, edited by Tadatomo Suga, Apr. 28, 2000, first edition, second print, pages 90–91). The present inventors researched the thermal fatigue of BGA balls and discovered that the thermal fatigue of BGA balls is related to the growth process of the intermetallic compound, which is formed by a reaction which occurs between the solder and the land during the solder bonding in the joining regions

SUMMARY OF INVENTION

In the BGA bonding, since horizontal stress is imparted to a narrow bonding region of a solder ball at the circumferential surface of the bonding portion, initial thermal fatigue is very liable to occur. More specifically, this stress accelerates the diffusion of Ni or Cu into the solder bulk, which Ni or Cu is contained in high concentration in the bonding region formed during the solder bonding. The intermetallic compound grows, therefore, thicker than that formed at the bonding, with the result that fatigue fracture occurs in the formation region of the intermetallic compound.

It is, therefore, an object of the present invention to suppress the Ni or Cu diffusion from the bonding interface into the bulk of the solder and to provide a lead-free solder alloy of BGA balls having improved resistance against thermal fatigue.

It is also an object of the present invention to suppress the Ni or Cu diffusion from the bonding interface into the bulk of the solder of BGA balls and to provide a lead-free solder joint having improved resistance against thermal fatigue.

In accordance with the objects of the present invention, there is provided a lead-free solder, which contains, by mass percentage, from 1.0 to 3.5% of Ag, from 0.1 to 0.7% of Cu, and from 0.1 to 2.0% of In, the balance consisting of unavoidable impurities and Sn. This composition may be referred to as the first composition.

There is also provided a lead-free solder, which contains, by mass percentage, from 1.0 to 3.5% of Ag, from 0.1 to 0.7% of Cu, from 0.1 to 2.0% of In, and at least one element selected from the group consisting of from 0.03 to 0.15% of Ni, from 0.01 to 0.1% of Co, and from 0.01 to 0.1% of Fe, balance consisting of unavoidable impurities and Sn. This composition may be referred to as the second composition.

In accordance with the objects of the present invention, there is provided a solder joint, which comprises: an Ni-based conductor; a bulk of lead-free solder, which has the first or second composition and has a structure essentially consisting of an Sn matrix with Cu solute and an Sn—Ag eutectic structure, in which a Cu—Sn based intermetallic compound and an Ag—Sn intermetallic compound are dispersed; and, an Ni—Sn based intermetallic compound layer formed at interface between the Ni-based conductor and the bulk of lead-free solder.

There is also provided a Cu-based conductor; a bulk of lead-free solder, which has the first or second composition and has a structure essentially consisting of an Sn matrix with Cu solute and an Sn—Ag eutectic structure, in which a Cu—Sn based intermetallic compound and an Ag—Sn intermetallic compound are dispersed; and, a Cu—Sn based intermetallic compound layer formed at an interface between the Cu-based conductor and the bulk of the lead-free solder.

DESCRIPTION OF PREFERRED EMBODIMENTS

In the present invention, the fundamental system is Sn—Ag eutectic and hypo-eutectic. This fundamental system has more improved thermal fatigue property than that of Sn—Pb eutectic. The additive elements are selected and are added in a specific amount in such a manner that the interface reaction is suppressed while the mechanical properties and wettability of the bulk are not adversely affected as compared with the Sn—Ag eutectic. The percentage of the composition is mass % hereinbelow.

In the present invention, Ag is added for the purpose of improving the wettability and lowering the melting point. When the Ag content is less than 1.0%, the melting point becomes too high. On the other hand, when the Ag content is more than 3.5%, the primary $Ag_3Sn$ is disadvantageously formed. The Ag content is, therefore, from 1.0 to 3.5%, preferably from 2.0 to 3.5%.

Cu is effective for lowering the melting point and is solubilized in the tin. Surprisingly, since the solidification speed of BGA balls is so high as to solubilize Cu in a large amount, the solute Cu is effective for suppressing the mutual diffusion between the same and Cu or Ni in the land. As a result, the diffusion of metal in the land into the bulk of the solder is suppressed. When the Cu content is less than 0.1%, these effects are slight. On the other hand, when the Cu content is more than 0.7%, the primary $Cu_6Sn_5$ is crystallized with the result that the strength and fatigue property are deteriorated. The Cu content is, therefore, from 0.1 to 0.7%, more preferably from 0.2 to 0.5%.

The Ag and Cu as well as Ni, Co and Fe mentioned below incur reduction of elongation. In (indium) suppresses the reduction of elongation and wettability mentioned above. The fatigue fracture is attributable to the growth of the intermetallic compound layer as described above. High elongation of the solder bulk suppresses the propagation of fatigue cracks and thus contributes to the improvement of resistance against thermal fatigue. When the indium content is less than 0.1%, the elongation and wettability are seriously impaired with the addition of Ag, Cu and the like. On the other hand, when the In content is more than 2.0%, In oxide is formed in a large amount such that the wettability is deteriorated. The In content is, therefore, from 0.1 to 2.0%, preferably from 0.3 to 1.0%.

The balance of the above components is essentially Sn. The solder alloy having this composition exhibits from 42 to 44 MPa of tensile strength at room temperature, from approximately 38 to 40% of elongation at room temperature, from approximately 76 to 79% of spreading ratio, and from 210 to 220° C. of melting point. The Sn-2.5Ag-3.0Bi-1.0In-0.2Cu solder-alloy developed by the present assignee and Toyota Central Research Co., Ltd. (hereinafter referred to as "the developed product") exhibits approximately 62 MPa of tensile strength at room temperature, approximately 25% of elongation at room temperature, from approximately 84% of spreading ratio, and from 202 to 215° C. of melting point. The inventive alloy has low strength and high elongation due to the omission of Bi as compared with the developed product. The cyclic heating test confirms that the resistance of the developed product against thermal fatigue is improved due to the Bi addition. However, the cyclic heating test of balls carried out in the present invention reveals that the fatigue strength at the interface is impaired by the Bi addition.

The solder alloy according to the present invention may additionally contain Ni, Co and/or Fe. Ni, Co and Fe are partly or entirely solubilized in the Sn matrix and enhance resistance against thermal fatigue.

Ni: The solute Ni in the Sn matrix suppresses the mutual diffusion between the Sn of the solder bulk and Cu or Ni of the land. The diffusion of this Ni or Cu into the bulk of the solder is, therefore, suppressed. When the Ni content is less than 0.03%, these effects are slight. On the other hand, when the Ni content exceeds 0.15%, $Ni_3Sn_4$ crystallizes as the primary crystals so that the mechanical properties of the bulk of the solder and the wettability are seriously impaired. The Ni content is, therefore, from 0.03 to 0.15%, preferably from 0.03 to 0.1%. Within these ranges, Ni seems to be partly solutionized in the Sn matrix.

Co: The solute Co in the Sn matrix suppresses the mutual diffusion between the Sn of the solder bulk and Cu or Ni of the land. The diffusion of this Ni or Cu into the bulk of the solder is, therefore, suppressed. When the Co content is less than 0.01%, these effects are slight. On the other hand, when the Co content exceeds 0.1%, the melting point drastically rises. The Co content is, therefore, from 0.01 to 0.1%, preferably from 0.01 to 0.05%. Within these ranges, Co seems to be totally or almost totally solutionized in the Sn matrix.

Fe: The solute Fe in the Sn matrix suppresses the mutual diffusion between the Sn of the solder bulk and Cu or Ni of the land. The diffusion of this Ni or Cu into the bulk of the solder is, therefore, suppressed. When the Fe content is less than 0.01%, these effects are slight. On the other hand, when the Fe content exceeds 0.1%, the melting point drastically rises. The Fe content is, therefore, from 0.01 to 0.1%, preferably from 0.01 to 0.05%. Within these ranges, Fe seems to be partly solutionized in the Sn matrix.

The solder mentioned above can be used for not only the BGA balls but also for the locations where the bonding-interface stress is large in the surface mounting.

The solder joint according to the present invention is hereinafter described.

The first solder joint is related to a joint of an Ni-based conductor and comprises the Ni—Sn based intermetallic compound layer and the bulk of the solder. The Ni—Sn based intermetallic compound layer is present at the interface between the Ni-based conductor and the bulk of the solder. This layer is present in the circumferential surface of a ball at its bonding portion with the Ni-based conductor. The bulk of the solder has an Sn—Ag eutectic structure, in which a Cu—Sn based intermetallic compound and an Ag—Sn based intermetallic compound are dispersed. The bulk of the solder has the first or second composition.

The Ni land and the solder according to the present invention are brought into contact with one another and form at their interface the Ni—Sn based intermetallic compound layer, which is mainly composed of $Ni_3Sn_4$ and the like. This intermetallic compound grows during the heating cycle.

The bulk of the solder has the first or second composition. Its structure is formed during the following solidification. The Sn first solidifies to form the matrix, while solubilizing Cu, In and the like. The eutectic reaction occurs subsequently. The resultant eutectic structure consists of the dispersed Sn crystals and Ag—Sn intermetallic compound. The eutectic point is located at 3.5% of Ag, the balance being Sn. Subsequent to or simultaneously with the eutectic reaction, the Cu—Sn based intermetallic compound is formed and disperses as well. A small amount of Cu, Fe, Ni, Co, and Ag is solubilized in the solidified Sn matrix. The solute Cu, Fe, Ni, Co and Ag retard the mutual diffusion between the Sn of the solder matrix and Ni or Cu, with the result that the generation of the intermetallic compound in the bulk layer is prevented. The bulk and the intermetallic compound layer can be distinguished from one another by an optical microscope, because the morphology of the intermetallic compound layer reflects the formation process described above.

The second solder joint is related to a joint of a Cu-based conductor and comprises the Cu—Sn based intermetallic compound layer and the bulk of the solder. The Cu—Sn based intermetallic compound layer is present at the interface between the Cu-based conductor and the bulk of the solder. The bulk of the solder has an Sn—Ag eutectic structure and dispersion phases of the Cu—Sn based intermetallic compound or the Ag—Sn intermetallic compound. The bulk of the solder has the first or second composition. In the case of the first composition, Cu is solubilized in the Sn matrix. In the case of the second composition, the added Fe, Ni or Co is solubilized in the Sn matrix, as well. In the second solder joint, the solute Cu, Fe, Ni and Co of the bulk of the solder suppress the diffusion of Cu from the land, and hence the growth of the intermetallic compound layer. The other points are the same as in the first solder joint.

The present invention is hereinafter described with reference to the examples.

EXAMPLES

The solder alloys having the composition shown in Table 1 were melted and cast into a strength-test specimen. The solder alloys were shaped by an ordinary method to solder balls (BGA balls) having 0.3 mm of diameter.

Testing Method of Spreading Ratio

A copper plate was polished by polishing paper (#1500), then cleaned with isopropyl alcohol, and then oxidized at 150° C. for 1 hour. Flux was applied on the so-treated copper plate, and the solder sample melted at 250° C. was spread on the copper plate. Change in the height of solder melt was measured after holding for 30 seconds. The results are shown in Table 1

Testing Method of Strength

The solder alloy was cast into a cylindrical specimen (30 mm of length of the parallel portion, and 2 mm diameter of the parallel portion). Heat treatment was carried out at 100° C. for 24 hours in order to stabilize the structure. The tensile test was carried out $1\times10^{-3}$/sec of strain speed and under 25° C. testing temperature. Three tests were carried out for each solder alloy (n=3).

Thermal Fatigue Property

The thermal fatigue property was evaluated by a thermal impact method. Twenty-seven BGA balls were bonded on a chip with the aid of flux, and the assembling on an evaluation substrate (FR-4, Cu land+Ni land) was carried out with the use of the Sn—Ag eutectic solder paste. The test was carried out for 1000 cycles of heating from −40° C. (20 minutes) to 125° C. (5 minutes) and cooling vice versa. Five balls, in which the stress under the thermal impact is greater than that of the other balls, were subjected to observation of the cross-section. The crack relative to the length of the bonding surface was measured to evaluate the progressing ratio of the crack. Thickness of the intermetallic compound layer at the bonding interface was also measured. The results are shown in Table 2. The greatest progressing ratio of cracks is shown in Table 1. The average thickness of the intermetallic compound layer with regard to five BGA balls is shown in Table 2.

In Table 2, the following symbols indicate the progressing ratio of cracks.

⊚: No occurrence of cracks
○: 10% or less of crack progressing ratio
Δ: 50% or less of crack progressing ratio
X: 100% of crack progressing ratio (fracture)

TABLE 1

|  | No. | Sn | Ag | Cu | In | Ni | Fe | Co | Tensile Strength (Mpa) | Elongation (%) | Spreading Ratio (%) |
|---|---|---|---|---|---|---|---|---|---|---|---|
| Examples | 1 | Bal. | 3.0 | 0.5 | 0.5 | 0.05 | 0.05 | 0.03 | 43 | 38 | 78.6 |
|  | 2 | Bal. | 3.0 | 0.5 | 0.5 | 0.05 | — | 0.03 | 43 | 41 | 76.8 |
|  | 3 | Bal. | 3.0 | 0.5 | 0.5 | 0.05 | 0.05 | — | 44 | 36 | 77.5 |
|  | 4 | Bal. | 3.0 | 0.5 | 0.5 | — | 0.05 | 0.03 | 42 | 39 | 77.3 |
| Comparative Examples | 5 | Bal. | 3.5 | — | — | — | — | — | 37 | 50 | 79.5 |
|  | 6 | Bal. | — | 0.7 | — | — | — | — | 24 | 33 | 78.1 |
|  | 7 | Bal. | 3.0 | 0.5 | — | — | — | — | 40 | 41 | 77.5 |
|  | 8 | Bal. | 3.0 | 0.5 | — | — | — | 0.03 | 41 | 41 | 75.0 |

TABLE 2

| | | Cycle of Thermal Impact Test | | | | | | | | |
|---|---|---|---|---|---|---|---|---|---|---|
| | | 0 | | 114 | | 342 | | 570 | | 1000 | |
| | No. | Thickness of Intermetallic Compound Layer (μm) | Crack Generation | Thickness of Intermetallic Compound Layer (μm) | Crack Generation | Thickness of Intermetallic Compound Layer (μm) | Crack Generation | Thickness of Intermetallic Compound Layer (μm) | Crack Generation | Thickness of Intermetallic Compound Layer (μm) | Crack Generation |
| Examples | 1 | 2.6 | ⊚ | 2.9 | ⊚ | 2.9 | ⊚ | 2.8 | ⊚ | 3.2 | ○ |
| | 2 | 2.8 | ⊚ | 2.8 | ⊚ | 3.0 | ⊚ | 3.0 | ⊚ | 3.5 | ○ |
| | 3 | 2.1 | ⊚ | 2.8 | ⊚ | 2.8 | ⊚ | 3.3 | ○ | 3.5 | ○ |
| | 4 | 2.3 | ⊚ | 2.5 | ⊚ | 2.9 | ⊚ | 3.5 | ○ | 3.7 | ○ |
| Comparative Examples | 5 | 3.1 | ⊚ | 3.9 | ○ | 4.2 | Δ | 4.8 | Δ | 5.6 | X |
| | 6 | 2.6 | ⊚ | 4.0 | Δ | 4.8 | Δ | 5.3 | X | 5.4 | X |
| | 7 | 2.5 | ⊚ | 3.6 | ○ | 3.9 | Δ | 4.3 | Δ | 5.0 | X |
| | 8 | 2.2 | ⊚ | 3.2 | ⊚ | 3.8 | Δ | 4.3 | Δ | 4.6 | Δ |

What is claimed is:

1. A lead-free solder, which contains, by mass percentage, from 1.0 to 3.5% of Ag, from 0.1 to 0.7% of Cu, from 0.1 to 2.0% of In, and at least one element selected from the group consisting of from 0.03 to 0.15% of Ni, from 0.01 to 0.1% of Co, and from 0.01 to 0.1% of Fe, the balance consisting of unavoidable impurities and Sn.

2. A lead-free solder according to claim 1, in the form of a ball of a ball-grid array.

3. A lead-free solder according to claim 2, wherein the ball has a diameter of from 0.1 to 1.2 mm.

4. A solder joint, which comprises: an Ni-based conductor; a bulk of lead-free solder, which contains, by mass percentage, from 1.0 to 3.5% of Ag, from 0.1 to 0.7% of Cu, and from 0.1 to 2.0% of In, the balance consisting of unavoidable impurities and Sn, and which essentially consists of an Sn matrix with Cu solute and an Sn—Ag eutectic structure, in which an Ni—Sn based intermetallic compound and an Ag—Sn intermetallic compound are dispersed; and, an Ni—Sn based intermetallic compound layer formed at an interface between the Ni-based conductor and the bulk of the lead-free solder.

5. A solder joint according to claim 4, wherein said bulk of lead-free solder contains, by mass percentage, from 1.0 to 3.5% of Ag, from 0.1 to 0.7% of Cu, from 0.1 to 2.0% of In, and at least one element selected from the group consisting of from 0.03 to 0.15% of Ni, from 0.01 to 0.1% of Co, and from 0.01 to 0.1% of Fe, balance consisting of unavoidable impurities and Sn.

6. A solder joint according to claim 4, wherein at least a part of said at least one element is solubilized in the Sn matrix.

7. A solder joint according to claim 4 or 5, wherein said the bulk of the lead-free solder is in the form of a ball of a ball grid array.

8. A solder joint according to claim 7, wherein said ball has a diameter of from 0.1 to 1.2 mm.

9. solder joint according to claim 8, wherein said Ni—Sn based intermetallic layer is formed at the circumferential surface of the ball at its end bonded with the Ni-conductor.

10. A solder joint, which comprises a Cu-based conductor; a bulk of lead-free solder, which contains, by mass percentage, from 1.0 to 3.5% of Ag, from 0.1 to 0.7% of Cu, and from 0.1 to 2.0% of In, the balance consisting of unavoidable impurities and Sn, and which has an Sn matrix with Cu solute, an Sn—Ag eutectic structure, a dispersion phase of a Cu—Sn based intermetallic compound and an Ag—Sn intermetallic compound; and a Cu—Sn based intermetallic compound layer formed at the interface between the Cu-based conductor and the bulk of the lead-free solder.

11. A solder joint according to claim 10 wherein said bulk of the lead-free solder contains, by mass percentage, from 1.0 to 3.5% of Ag, from 0.1 to 0.7% of Cu, from 0.1 to 2.0% of In, and at least one element selected from the group consisting of from 0.03 to 0.15% of Ni, from 0.01 to 0.1% of Co, and from 0.01 to 0.1% of Fe, balance consisting of unavoidable impurities and Sn.

12. A solder joint according to claim 10 or 11, wherein said the bulk of the lead-free solder is in the form of a ball of a ball grid array.

13. Claim A solder joint according to claim 12, wherein said ball has a diameter of from 0.1 to 1.2 mm.

* * * * *